United States Patent
Ito et al.

(10) Patent No.: US 10,419,084 B2
(45) Date of Patent: Sep. 17, 2019

(54) WIRELESS COMMUNICATION DEVICE AND WIRELESS COMMUNICATION METHOD

(71) Applicant: Hitachi Kokusai Electric Inc., Minato-ku, Tokyo (JP)

(72) Inventors: Kei Ito, Kodaira (JP); Daiki Hoshi, Kodaira (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 16/304,294

(22) PCT Filed: May 12, 2017

(86) PCT No.: PCT/JP2017/018038
§ 371 (c)(1),
(2) Date: Nov. 25, 2018

(87) PCT Pub. No.: WO2017/204007
PCT Pub. Date: Nov. 30, 2017

(65) Prior Publication Data
US 2019/0089422 A1   Mar. 21, 2019

(30) Foreign Application Priority Data
May 26, 2016   (JP) .................. 2016-105572

(51) Int. Cl.
*H04B 7/04* (2017.01)
*H04B 7/0413* (2017.01)
*H03M 13/45* (2006.01)
*H04B 7/08* (2006.01)
*H04L 1/00* (2006.01)

(52) U.S. Cl.
CPC .......... *H04B 7/0413* (2013.01); *H03M 13/45* (2013.01); *H04B 7/0854* (2013.01); *H04L 1/0054* (2013.01)

(58) Field of Classification Search
CPC ... H04B 7/0413; H04B 7/0854; H03M 13/45; H04L 1/0054
See application file for complete search history.

(56) References Cited

U.S. PATENT DOCUMENTS

2014/0192936 A1* 7/2014 Fukawa ............... H04B 7/0854
375/341
2015/0381251 A1* 12/2015 Murakami ........... H04B 7/0697
370/330

FOREIGN PATENT DOCUMENTS

JP            4188371 B2    11/2008

* cited by examiner

*Primary Examiner* — Curtis B Odom
(74) *Attorney, Agent, or Firm* — Greer, Burns & Crain, Ltd.

(57) ABSTRACT

A wireless communication device suppresses increase in computation scale when applying maximum likelihood detection to a multi-level modulation scheme. Units calculate a likelihood, bit log-likelihood ratio, and mutual information content for the separation result of a received signal on the basis of the signal point of a reference selected from among a plurality of signal points that a transmitted signal can assume. A transmission candidate point selection unit selects signal points in a number that corresponds to the mutual information content as transmission candidate points from among the plurality of signal points in ascending order of distance to 0 and distance to 1 for each modulation bit that constitutes the signal point of the reference. A reception candidate point that is a candidate for the received signal is calculated. An external LLR calculation unit calculates the bit log-likelihood ratio by an MLD method.

3 Claims, 10 Drawing Sheets

Selection of first from the top in the ranking

FIG.2B

Selection of second from the top in the ranking

FIG.3A

Selection of second from the top in the ranking

FIG.3B

×: MMSE output point
◯: Selected transmission candidate point

Selection of third from the top in the ranking

FIG.4A

Distance from transmission candidate point

| $b_0=1$ | | | | $b_0=0$ | | | |
|---|---|---|---|---|---|---|---|
| Candidate point number | Bit value | Coordinates | Distance | Candidate point number | Bit value | Coordinates | Distance |
| 44 | 101100 | (-1, 1) | 4.5 | 9 | 001001 | (1, 5) | 18.5 |
| 45 | 101101 | (-1, 3) | 2.5 | 11 | 001011 | (3, 5) | 36.5 |
| 46 | 101110 | (-3, 1) | 2.5 | 12 | 001100 | (1, 1) | 14.5 |
| 47 | 101111 | (-3, 3) | 0.5 | 13 | 001101 | (1, 3) | 12.5 |
|  |  |  |  | 14 | 001110 | (3, 1) | 32.5 |
|  |  |  |  | 15 | 001111 | (3, 3) | 30.5 |
|  |  |  |  | 28 | 011100 | (1, -1) | 24.5 |
|  |  |  |  | 30 | 011110 | (3, -1) | 42.5 |

FIG.4B

Order and candidate point number

| $b_0=1$ | | | | $b_0=0$ | | | |
|---|---|---|---|---|---|---|---|
| Order | Candidate point number | Bit value | Coordinates | Order | Candidate point number | Bit value | Coordinates |
| 1 | 47 | 101111 | (-3, 3) | 1 | 13 | 001101 | (1, 3) |
| 2 | 45 | 101101 | (-1, 3) | 2 | 12 | 001100 | (1, 1) |
| 3 | 46 | 101110 | (-3, 1) | 3 | 9 | 001001 | (1, 5) |
| 4 | 44 | 101100 | (-1, 1) | 4 | 28 | 011100 | (1, -1) |
|  |  |  |  | 5 | 15 | 001111 | (3, 3) |
|  |  |  |  | 6 | 14 | 001110 | (3, 1) |
|  |  |  |  | 7 | 11 | 001011 | (3, 5) |
|  |  |  |  | 8 | 30 | 011110 | (3, -1) |

WIRELESS COMMUNICATION DEVICE AND WIRELESS COMMUNICATION METHOD

TECHNICAL FIELD

Priority is claimed to Japan Patent Application No. 2016-105572 filed May 26, 2016, and to International Application No. PCT/JP2017/018038 filed May 12, 2017, and all of the contents of the foregoing are herein incorporated by reference in their entirety for all purposes. The present invention relates to a MIMO (Multiple Input Multiple Output) type signal processing technology for carrying out data demodulation by using the characteristics of the transmission path between the transmission and reception sides where a wireless communication device on the transmission side transmits signals having the same frequency but different data from multiple transmission antenna, and a wireless communication device on the reception side receives these signals by multiple receive antenna, respectively.

BACKGROUND ART

Methods for separating and detecting a transmission stream on the receiver side in a spatial multiplexing type MIMO communication for transmitting different information from multiple transmission antenna include methods using a spatial filter such as a ZF (Zero Forcing) method and an MMSE (Minimum Mean Square Error) method as in Non-Patent Document 1. However, sufficient performance cannot be achieved in these methods, though the computation is not complicated.

Meanwhile, MLD (Maximum Likelihood Detection) demodulation for selecting the closest signal points from among all the signal points that can be taken by the transmission signals as a result of the estimation of a transmission path is also known. Though this has high detection performance, the computation scale increases exponentially when the number of antennas or the number of modulation multiple values increase, which makes it difficult to be applied to an actual system.

In recent years, super multi-level modulation systems such as 256 QAM (Quadrature Amplitude Modulation) and 1024 QAM have been adopted as a wireless communication system. In contrast to these, it is obvious that the application of MLD is not realistic.

A typical method for decreasing the computation scale in an MLD is an SD (Sphere Decoding) method. According to an SD method, reception candidate points within a certain distance range from the reception point are narrowed down from among the generated reception candidate points (replicas) so that an MLD operation is carried out targeting the narrowed-down reception candidate points.

In Patent Document 1, a hard decision is made on the results of demodulation gained in accordance with a ZF method or an MMSE method, and the hard determination points and the points in its vicinity are used as transmission candidate points in order to reduce the MLD operation by reducing the transmission candidate points and the reception candidate points that are generated therefrom.

PRIOR ART DOCUMENT

Patent Document

Patent Document 1: Japan Patent No. 4188371

Non-Patent Document

Non-Patent Document 1: Hirotsugu Kubo, Akihiro Okazaki, "Knowledge Base of the Institute of Electronics, Information and Communication Engineers, Group 4, Section 1: Wireless Communication Basic, Chapter 8: Demodulation Technology," [online], the Institute of Electronics, Information and Communication Engineers, [searched on Apr. 1, 2016], <Internet URL: http://www.ieice-hbkb.org/portal/doc_510.html>

SUMMARY OF INVENTION

Technical Problem

In accordance with the technique in Patent Document 1, the selected transmission candidate points do not necessarily include a transmission candidate point having 0 and 1 for the respective modulation bits, and thus, the calculation of a bit log likelihood ratio (hereinafter, log likelihood ratio is referred to as LLR), which is a ratio of the probability of the bit being 0 to the probability of the bit being 1, is not necessarily possible. In the case where an LLR cannot be calculated, such a problem arises that error correction decoding having an LLR as an input or turbo signal processing using an LLR cannot be applied.

The present invention is provided in view of the above-described conventional situation, and an object of the invention is to provide a technology that makes it possible to effectively suppress an increase in the computation scale in the case where MLD is applied to a multiple value modulation system.

Solution to Problem

In order to achieve the above-described object, the present invention provides a wireless communication device, for receiving signals transmitted from multiple transmission antenna by multiple receive antenna and separating received signals, with a configuration having the following operation.

A transmission path estimation unit in the configuration estimates a transmission path between the transmission and reception sides on a basis of the signals received by the multiple receive antenna. A noise power estimation unit estimates a received noise power on a basis of the received signals. A separation unit separates the received signals by a linear filter in accordance with a ZF method or an MMSE method by using the results of estimation of the transmission path and the results of estimation of the received noise power. A likelihood calculation unit calculates the likelihood of between the results of separation by the separation unit and a reference signal point selected from among a plurality of signal points that can be taken by transmission signals. A first bit LLR calculation unit calculates a bit LLR by using the likelihood calculated by the likelihood calculation unit. A mutual information calculation unit calculates a mutual information by using the bit LLR calculated by the first bit LLR calculation unit. A selection unit selects, from among the plurality of signal points, signal points of which the number corresponds to the mutual information calculated by the mutual information calculation unit as transmission candidate points in an order of smaller to larger a distance from 0 and a distance from 1 for each modulation bit that forms the reference signal point. A reception candidate point calculation unit calculates the reception candidate points that become the candidates of the received signals by using the results of estimation of the transmission path and the transmission candidate points. A second bit LLR calculation unit calculates a bit LLR in accordance with an MLD method by using the reception candidate points, the received signals, and the results of estimation of the received noise power.

As described above, the wireless communication device according to the present invention has such an approximate configuration that the likelihood of the results of separation of the received signals, the bit LLR and the mutual information are calculated on the basis of the reference signal point selected from among the plurality of signal points that can be taken by the transmission signals, signal points of which the number corresponds to the mutual information are selected as the transmission candidate points in such an order that the distance from 0 and the distance from 1 for each modulation bit that forms the reference signal point (the distance is bit likelihood) are smaller, and an MLD operation is carried out by calculating the reception candidate points through the use of the transmission candidate points.

Therefore, in the wireless communication device according to the present invention, an MLD operation is carried out by calculating reception candidate points from the transmission candidate points that have been narrowed down on the basis of the respective bit likelihoods and the mutual information, and therefore, an increase in the computation scale in the case where MLD is applied to a multiple value modulation system can be effectively suppressed. As a result, it becomes possible to apply MLD that has been considered to be unrealistic in the QAM of super multi-level modulation to an actual system.

Here, the wireless communication device according to the present invention may have such a configuration where an error correction unit that outputs a bit LLR of which the errors have been corrected using as an input the bit LLR calculated by the first bit LLR calculation unit is provided, and the second bit LLR calculation unit uses the bit LLR outputted from the error correction unit as a prior bit LLR so as to calculate the bit LLR in accordance with the MLD method by using the reception candidate points, the received signals, the results of estimation of the received noise power, and the prior bit LLR so that a further increase in the performance can be achieved.

Advantageous Effects of Invention

The present invention makes it possible to effectively suppress an increase in the computation scale in the case where MLD is applied to a multiple value modulation system.

DESCRIPTION OF EMBODIMENTS

The wireless communication device according to the present invention is described in reference to the drawings.

The wireless communication device according to the present invention forms a MIMO type wireless communication system where a plurality of antennas are used for the transmission and reception of data. That is to say, another wireless communication device on the transmission side transmits signals having the same frequency but different data through multiple transmission antenna, and the wireless communication device according to the present invention on the reception side receives these signals by multiple receive antenna, respectively, so that data demodulation is carried out using the characteristics of the transmission path between the transmission and reception sides.

Figure 1:
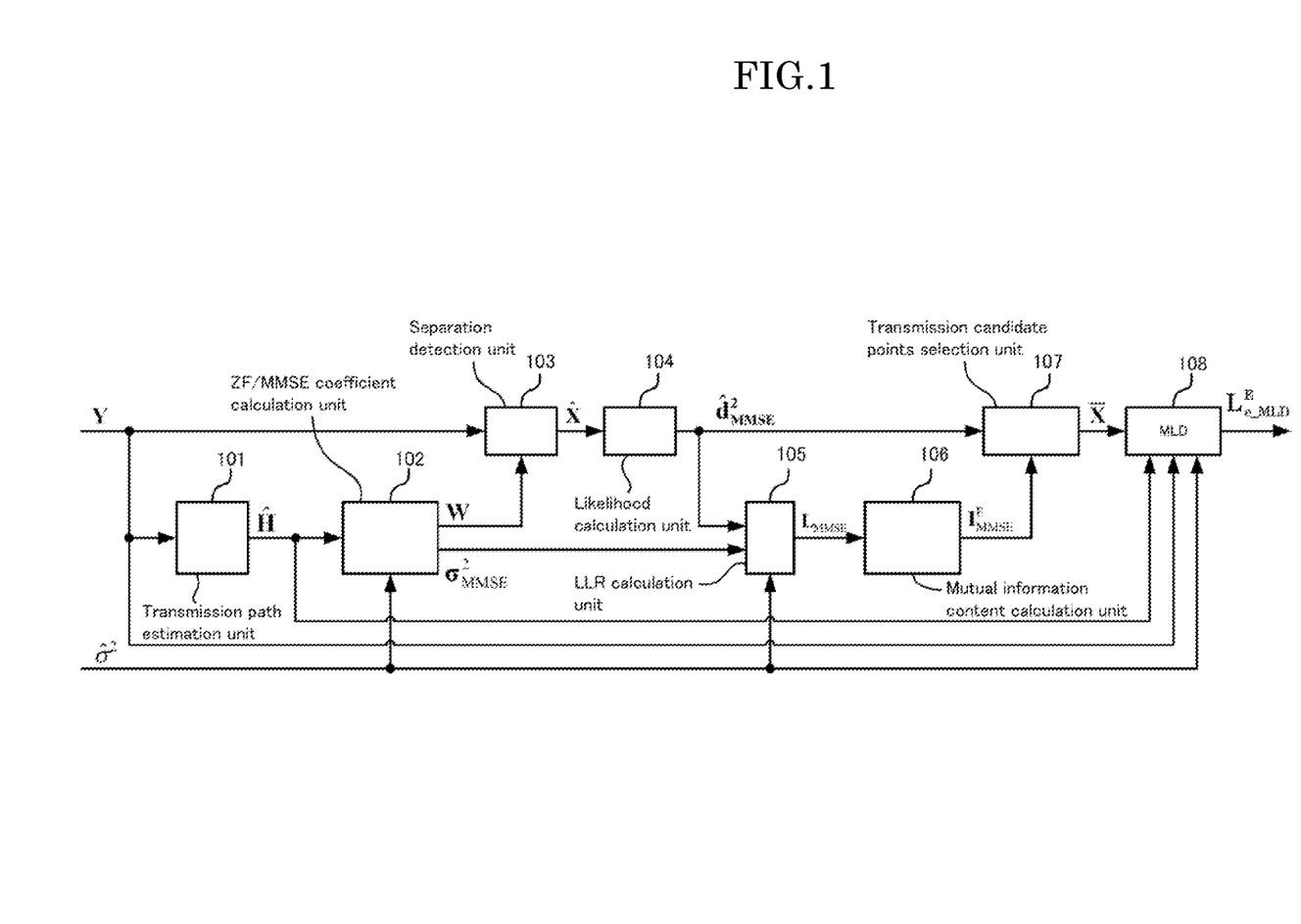
FIG. 1 is a diagram showing an example of a functional block of the wireless communication device according to the first embodiment of the present invention.

FIG. 1 shows an example of the functional block of the wireless communication device according to the first embodiment of the present invention. The wireless communication device according to the first embodiment is provided with a transmission path estimation unit 101, a ZF/MMSE coefficient calculation unit 102, a separation detection unit 103, a likelihood calculation unit 104, an LLR calculation unit 105, a mutual information calculation unit 106, a transmission candidate point selection unit 107 and an MLD processing unit 108.

A reception frequency signal vector Y that indicates signals that have been received by multiple receive antenna is inputted into the transmission path estimation unit 101, which estimates the transmission path between the transmission and reception sides by using the known signals included in the reception frequency signal vector Y, and outputs a transmission path estimation matrix H^ to the ZF/MMSE coefficient calculation unit 102 and the MLD processing unit 108. Here, the reception frequency signal vector Y is Y=[$Y_1, \ldots, Y_{N_{rx}}$], where $N_{rx}$ is the number of reception antennas.

The ZF/MMSE coefficient calculation unit 102 uses the transmission path estimation matrix H^ and an SNR (Signal-to-Noise Ratio) γ to find a weight matrix W in compliance with the ZF or MMSE standard and outputs the weight matrix W to the separation detection unit 103. As described in Non-Patent Document 1, the weight matrix W is a linear filter represented in the following in the case of ZF.

[Formula 1]

$$W^T = (H^H H)^{-1} H^H \quad \text{(Formula 1)}$$

The weight matrix W is a linear filter represented in the following in the case of MMSE.

[Formula 2]

$$W^T = (H^H H + \hat{\sigma}^2 I_{N_{rx}})^{-1} H^H \quad \text{(Formula 2)}$$

Here, $\sigma^{\wedge 2}$ is a received noise power which is estimated by a noise power estimation unit (not shown) on the basis of signals received by the multiple receive antenna. In addition, the amplitude after MMSE is a diagonal component of the matrix S that is found as follows.

[Formula 3]

$$S = W^T H \quad \text{(Formula 3)}$$

When the certain stream i in the diagonal component is $S_i$, the SNR $\gamma_i$ after MMSE is represented in the following formula.

[Formula 4]

$$\gamma_i = \frac{S_i}{1 - S_i} \quad \text{(Formula 4)}$$

The noise power after MMSE is represented in the following formula.

[Formula 5]

$$\sigma^2_{MMSE}(i) = \frac{1}{\gamma_i} \quad \text{(Formula 5)}$$

The separation detection unit 103 uses the received frequency signal vector Y and the weight matrix W for separation so as to find the stream vector $\hat{X}$, which is then outputted to the likelihood calculation unit 104. The separation detection is carried out as in the following formula.

[Formula 6]

$$\hat{X} = W^T Y \quad \text{(Formula 6)}$$

Here, the stream vector $\hat{X}$ is $\hat{X} = [X_1, \ldots, X_{Ntx}]$, where $N_{tx}$ is the number of transmission antennas.

That is to say, the ZF/MMSE coefficient calculation unit 102 and the separation detection unit 103 uses the results of estimation of the transmission path and the results of estimation of the received noise power so as to separate signals received by a linear filter in accordance with the ZF method or the MMSE method.

In the following, an example of the case where the MMSE method is used is described, and the same description can be applied to the case where the ZF method is used.

The likelihood calculation unit 104 calculates the likelihood (distance) $\hat{d}^2_{MMSE}$ between the stream vector $\hat{X}$ that has been inputted through the separation detection unit 103 as a reception point (MMSE output point) and the transmission candidate point $X^-$, and outputs the likelihood $\hat{d}^2_{MMSE}$ to the LLR calculation unit 105 and the transmission candidate point selection unit 107. The calculation of each component $\hat{d}_{MMSE}(m, i)$ of $\hat{d}^2_{MMSE}$ is carried out in the following formula, for example.

[Formula 7]

$$\hat{d}_{MMSE}^2(m,i) = |\hat{X}_m - \hat{X}_i|^2 \quad \text{(Formula 7)}$$

Here, m is a mapping dot number, and $m = 1, \ldots, M$, where M is the transmission antenna number of the corresponding stream i. The calculation of the distance (likelihood) does not target all the transmission candidate points that could be a candidate of the transmission signal point (symbol), but the distance to the transmission candidate points with minimum number is calculated from the coordinates of the reception point (stream vector $\hat{X}$) and the bit arrangement of the symbol mapping.

Figure 2A:
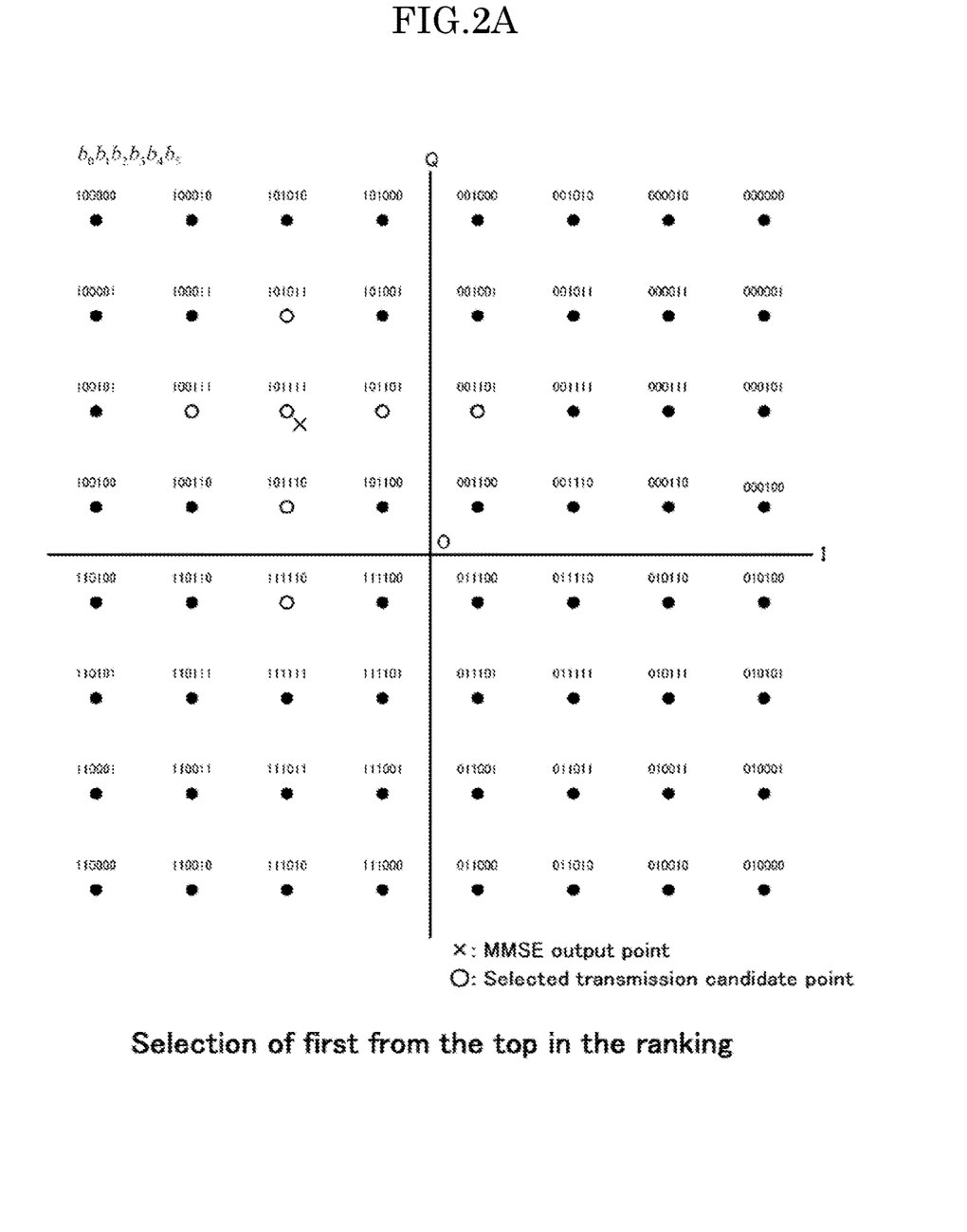
FIGS. 2A and 2B are diagrams showing examples of selection of transmission candidate points in 64 QAM.
Figure 2B:
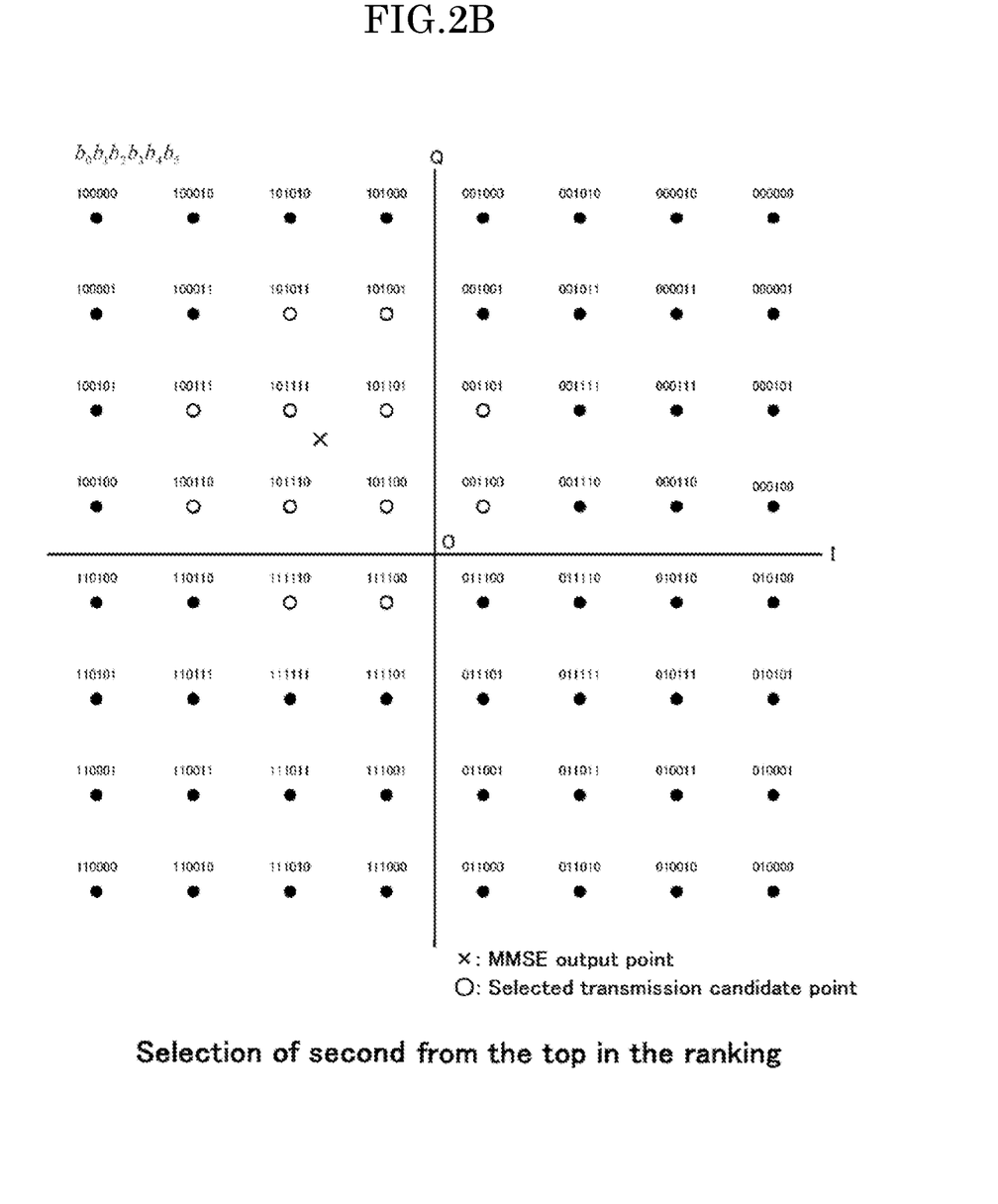

The distance to the transmission candidate points with minimum number is described by citing an example of the uppermost bit $b_0$ of 64 QAM. $b_0$ is arranged symmetrically relative to the Q axis as shown in FIG. 2. Here, in the case where the reception point (× in the figure) is in the region of $b_0 = 1$, the distance to the transmission candidate points in the region of $b_0 = 0$ is sufficient to calculate only for the transmission candidate points close to the Q axis from among all the transmission candidate points in the region of $b_0 = 0$. Here, the transmission candidate points that becomes the calculation target (the transmission candidate points with minimum number) is uniquely determined depending on the region in which the reception point belongs, and therefore may be preset.

The LLR calculation unit 105 uses the inputted distance likelihood $\hat{d}^2_{MMSE}$ and the noise power $\sigma^2_{MMSE}$ after MMSE so as to calculate the bit LLR $L_{MMSE}$, which is then outputted to the mutual information calculation unit 106. When each component of $\sigma^2_{MMSE}$ is $\sigma^2_{MMSE}(i)$, each component $L_{MMSE}(b_m, i)$ of the bit LLR $L_{MMSE}$ is calculated as follows.

[FIG. 8]

$$L_{MMSE}(b_m, i) = \log \left( \frac{\sum_{\hat{d}^2_{MMSE}(m,i)|b_m=0} \frac{1}{\pi \sigma_i^2} \exp\left(-\frac{\hat{d}^2_{MMSE}(m,i)}{\sigma^2_{MMSE}(i)}\right)}{\sum_{\hat{d}^2_{MMSE}(m,j)|b_m=1} \frac{1}{\pi \sigma_i^2} \exp\left(-\frac{\hat{d}^2_{MMSE}(m,i)}{\sigma^2_{MMSE}(i)}\right)} \right) \quad \text{(Formula 8)}$$

$$= \log \left( \frac{\sum_{\hat{d}^2_{MMSE}(m,i)|b_m=0} \exp\left(-\frac{\hat{d}^2_{MMSE}(m,i)}{\sigma^2_{MMSE}(i)}\right)}{\sum_{\hat{d}^2_{MMSE}(m,j)|b_m=1} \exp\left(-\frac{\hat{d}^2_{MMSE}(m,i)}{\sigma^2_{MMSE}(i)}\right)} \right)$$

$$= \log \left( \sum_{\hat{d}^2_{MMSE}(m,i)|b_m=0} \exp\left(-\frac{\hat{d}^2_{MMSE}(m,i)}{\sigma^2_{MMSE}(i)}\right) \right) - \log \left( \sum_{\hat{d}^2_{MMSE}(m,i)|b_m=1} \exp\left(-\frac{\hat{d}^2_{MMSE}(m,i)}{\sigma^2_{MMSE}(i)}\right) \right)$$

Here, the following approximation formula (Formula 9) is used to convert the above (Formula 5) to that as in the following formula (Formula 10).

[Formula 9]

$$\log\left(\sum_k \exp(a_k)\right) \cong \max_k(a_k) \quad \text{(Formula 9)}$$

-continued

[Formula 10]

$$L_{MMSE}(b_m, i) = \frac{1}{\sigma^2_{MMSE}(i)}\left(\min_{\hat{d}^2_{MMSE}(m,i)|b_m=0}\left(\hat{d}^2_{MMSE}(m, i)\right) - \min_{\hat{d}^2_{MMSE}(m,i)|b_m=1}\left(\hat{d}^2_{MMSE}(m, i)\right)\right)$$

(Formula 10)

Here, $b_m$ is $b_m=1$, $\log_2 M$, which is an index of the bit that forms the transmission candidate point of the mapping point number m. Accordingly, the bit LLR is found from the difference between the minimum distance between the bit and 0 and the minimum distance between the bit and 1.

The mutual information calculation unit 106 uses the inputted bit LLR $L_{MMSE}$ so as to find the mutual information $I_{MMSE}^E$, which is then outputted to the transmission candidate point selection unit 107. Each stream component $I_{MMSE}^E(i)$ of the mutual information $I_{MMSE}^E$ is calculated in the following formula, for example.

[Formula 11]

$$I_{MMSE}^E(i)=E[1+p_0(b_m,i)\log p_0(b_m,i)+p_1(b_m,i)\log p_1(b_m,i)]$$

(Formula 11)

Here, $E[\cdot]$ represents the sample average, and $p_0$ and $p_1$ are bit probabilities that are found as in the following from the respective bits LLR $L_{MMSE}(b_m, i)$.

[Formula 12]

$$p_0(b_m, i) = \frac{1}{1 + \exp(-L_{MMSE}(b_m, i))}$$

(Formula 12)

[Formula 13]

$$p_1(b_m, i) = \frac{1}{1 + \exp(L_{MMSE}(b_m, i))}$$

(Formula 13)

The transmission candidate point selection unit 107 uses the inputted likelihood $\hat{d}_{MMSE}^2$ and the mutual information $I_{MMSE}^E$ so as to select the transmission candidate point, and outputs the selected transmission candidate point to the MLD processing unit 108. The method for selecting the transmission candidate point is described as follows.

Figure 3A:
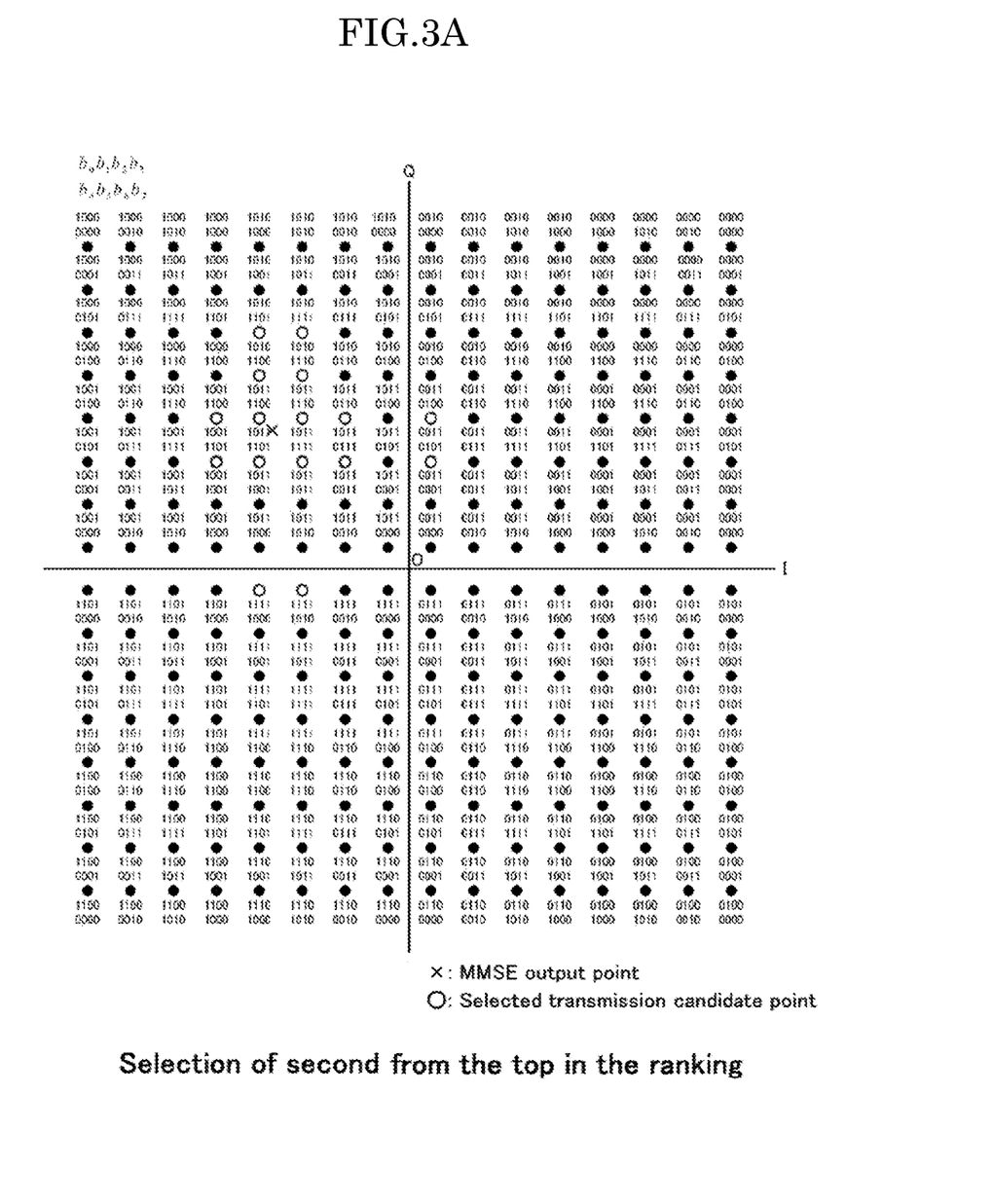
FIGS. 3A and 3B are diagrams showing examples of selection of transmission candidate points in 256 QAM.
Figure 3B:
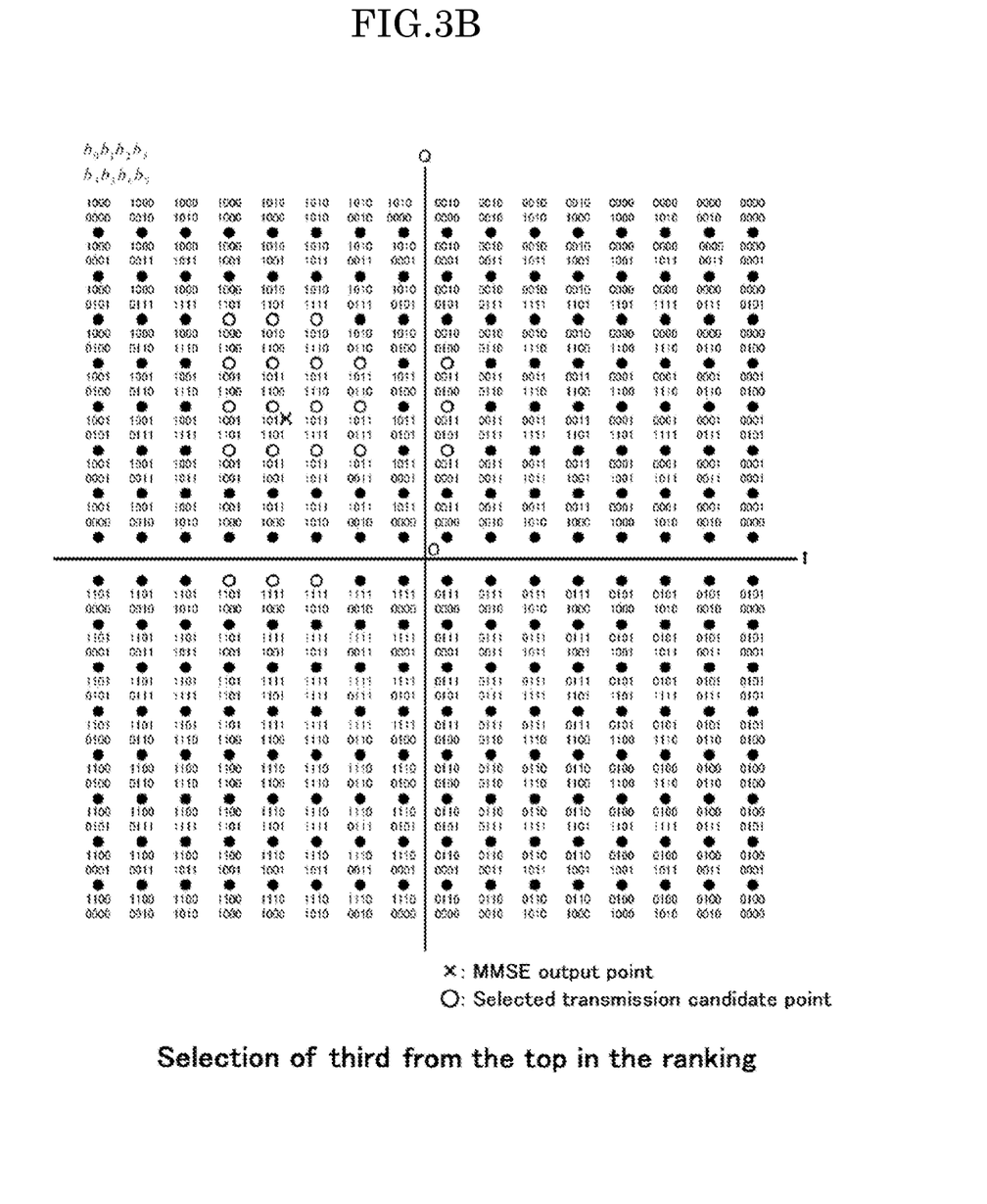

FIGS. 2A and 2B show examples of selection of transmission candidate points in 64 QAM, and FIGS. 3A and 3B show examples of selection of transmission candidate points in 256 QAM. In FIGS. 2A through 3B, the transmission candidate points are represented on an IQ plane where the lateral axis represents the I (In-Phase) components and the longitudinal axis represents the Q (Quadrature) components. × represents an MMSE output point (reception point), ○ represents a selected transmission candidate point, and ● represents an unselected transmission candidate point. The $R_d^{th}$ transmission candidate points from the top are selected where the distance between each modulation bit and 0 and the distance between each modulation bit and 1 are small with the MMSE output points being targeted. $R_d$ is determined depending on the modulation system and the value of the mutual information $I_{MMSE}^E$.

In addition, the number of would-be transmission candidate points that are determined by $R_d$ is $R_d(1+\log_2 M)$ at maximum in the case where it is simply assumed that the number of transmission points proximate to the MMSE output is $R_d$ and the number of transmission candidate points for each stream is M, because the number of existing proximate transmission points and existing transmission points that make a pair (1 or 0) with the modulation bit (0 or 1) that forms the proximate transmission point are the modulation bit number $\log_2 M$. Here, the reason why the expression at maximum is used is because some points in the $R_d^{th}$ from the top where the distance of each modulation bit is small may overlap. FIG. 2A (example of 64 QAM) shows an example of selection of the transmission candidate points of which the rank is first from the top, and FIG. 2B shows as example of selection of the transmission candidate points of which the rank is up to the second from the top. In addition, FIG. 3A (example of 256 QAM) shows an example of selection of the transmission candidate points of which the rank is up to the second from the top, and FIG. 3B shows an example of selection of the transmission candidate points of which the rank is up to the third from the top.

Figure 4A:
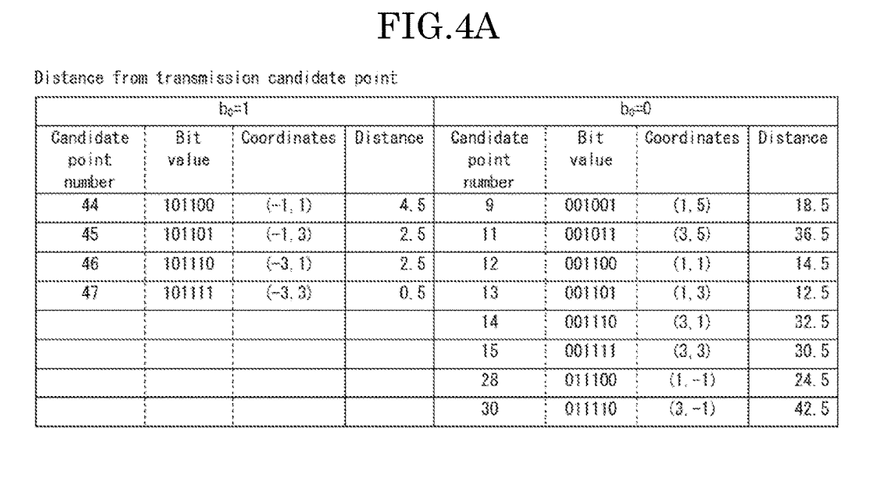
FIGS. 4A and 4B are tables for illustrating how transmission candidate points are selected.
Figure 4B:
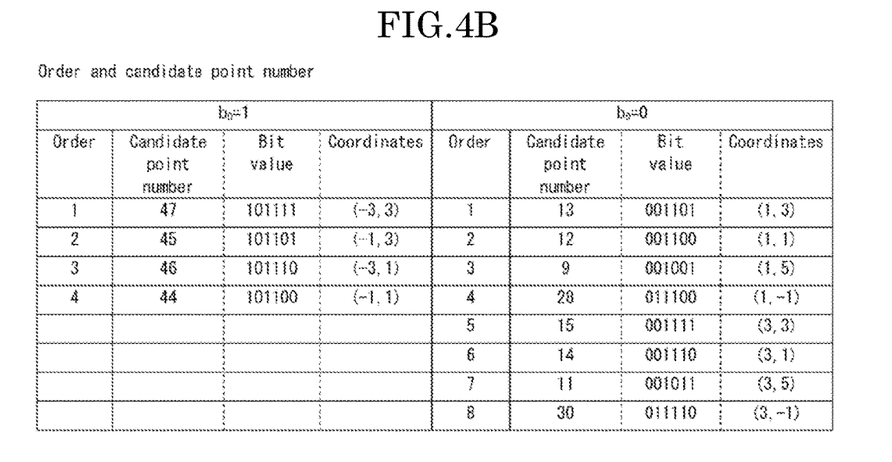

How the transmission candidate points are selected is described by citing an example of a case of 64 QAM (see FIGS. 2A and 2B). Here, each transmission candidate point is at a coordinate point of which the values along the I axis and the Q axis are any of −7, −5, −3, −1, 1, 3, 5, or 7. In addition, the distance from each transmission candidate point is as in FIG. 4A when the coordinates of the reception point on the IQ plane is (−2.5, 2.5). These distances are used as the evaluation reference so as to sort the candidate point numbers in the ascending order to find the results shown in FIG. 4B. The transmission candidate points of which the rank is the $R_d^{th}$ from the top may be selected from the results of this sorting.

The calculation amounts in the conventional MLD and in the MLD according to the present invention are described as follows. When the number of transmission points in each stream is M and the number of transmission antennas is $N_{tx}$, the number of generated reception candidate points is $M^{N_{tx}}$. When the number of ranks from the top in terms of selection in the present invention is $R_d$, the number of generated reception candidate points is $(R_d(1+\log_2 M))^{N_{tx}}$. Here, the dominant calculation amount is $2^{N_{tx}M'}$ in the conventional MLD and $(R_dM')^{N_{tx}}$ in the MLD according to the present invention, where $\log_2 M$ is represented by M'.

The MLD processing unit 108 uses the inputted transmission candidate point matrix X', the received frequency signal vector Y, the transmission path estimation matrix Ĥ and the received noise power $\sigma^{\wedge 2}$ so as to find LLR $L_{MLD}$, which is then outputted. The MLD processing unit 108 is described in detail in reference to FIG. 5.

Figure 5:
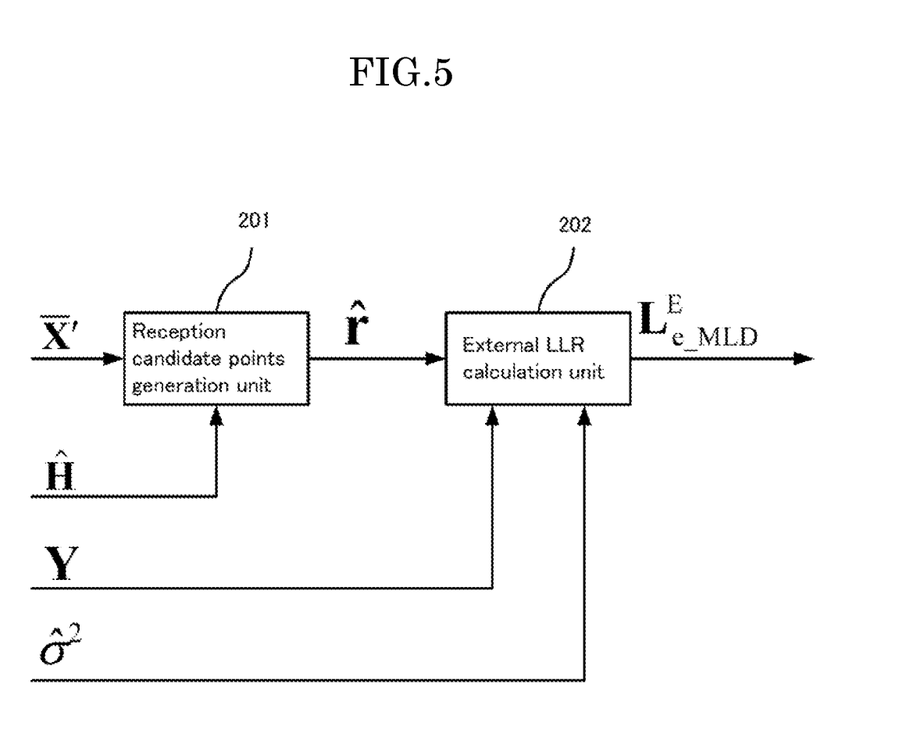
FIG. 5 is a diagram showing an example of the configuration of the MLD processing unit in the first embodiment of the present invention.

FIG. 5 shows an example of the configuration of the MLD processing unit 108 in the first embodiment. The MLD processing unit 108 is provided with a reception candidate point generation unit 201 and an external LLR calculation unit 202.

The reception candidate point generation unit 201 uses the inputted transmission candidate point vector X' and the transmission path estimation matrix Ĥ so as to generate a reception candidate point vector r̂, which is then outputted to the external LLR calculation unit 202. The reception candidate point vector r̂ is generated as in the following formula.

[Formula 14]

$$\hat{r}=\hat{H}X'$$

(Formula 14)

Here, the reception candidate point vector r̂ is $\hat{r}=[\hat{r}_1, \ldots, \hat{r}_Q]$ when the number of reception candidate points is Q.

The external LLR calculation unit 202 uses the inputted reception candidate point vector r̂, the received frequency signal vector Y and the received noise power $\sigma^{\wedge 2}$ so as to find the bit LLR $L_{eMLD}^E$, and outputs the bit LLR $L_{eMLD}^E$. Each component $L_{eMLD}^E(b_q, j)$ of the bit LLR $L_{eMLD}^E$ is calculated in the following formula, for example.

[Formula 15]

$$L^E_{e\ MLD}(b_q, j) = \log \left\{ \frac{\sum_{\hat{r}_q | b_q = 0} \frac{1}{\pi \hat{\sigma}^2} \exp\left(-\left(\sum_q \frac{|\hat{r}_q - Y_j|}{\hat{\sigma}^2}\right)\right)}{\sum_{\hat{r}_q | b_q = 1} \frac{1}{\pi \hat{\sigma}^2} \exp\left(-\left(\sum_j \frac{|\hat{r}_q - Y_j|}{\hat{\sigma}^2}\right)\right)} \right\}$$

(Formula 15)

$$= \log \left\{ \frac{\sum_{\hat{r}_q | b_q = 0} \exp\left(-\left(\sum_q \frac{|\hat{r}_q - Y_j|}{\hat{\sigma}^2}\right)\right)}{\sum_{\hat{r}_q | b_q = 1} \exp\left(-\left(\sum_q \frac{|\hat{r}_q - Y_j|}{\hat{\sigma}^2}\right)\right)} \right\}$$

$$= \log\left(\sum_{\hat{r}_q\ b_q = 0} \exp\left(-\left(\sum_q \frac{|\hat{r}_q - Y_j|}{\hat{\sigma}^2}\right)\right)\right) - \log\left(\sum_{\hat{r}_q\ b_q = 1} \exp\left(-\left(\sum_q \frac{|\hat{r}_q - Y_j|}{\hat{\sigma}^2}\right)\right)\right)$$

Here, the above-described approximation (Formula 9) is used to convert (Formula 15) to the following formula.

[Formula 16]

$$L^E_{e\ MLD}(b_q, j) = \min_{\hat{r}_q | b_q = 0}\left(\frac{|\hat{r}_q - Y_j|}{\hat{\sigma}^2}\right) - \min_{\hat{r}_q | b_q = 1}\left(\frac{|\hat{r}_q - Y_j|}{\hat{\sigma}^2}\right)$$

(Formula 16)

Here, the index q is the reception candidate point number, and q=1, . . . , Q, whereas $b_q$ is an index of the bit that forms the reception candidate point with the reception candidate point number q.

Figure 6:
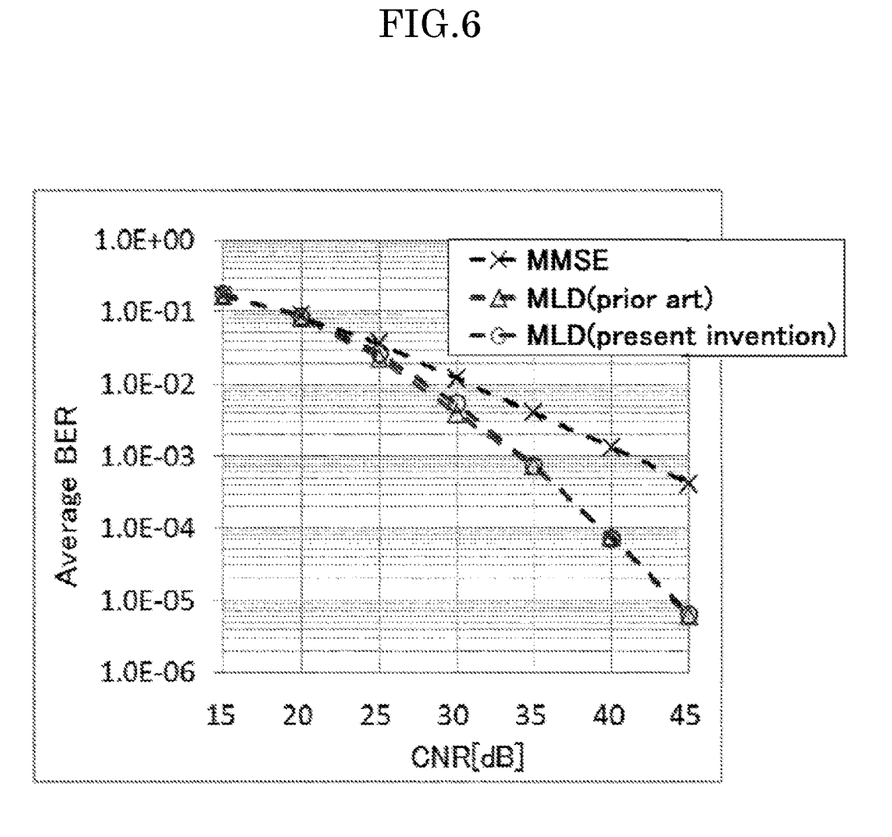
FIG. 6 is a graph showing an example of the characteristics in terms of the bit error ratio in the first embodiment of the present invention.

FIG. 6 shows an example of the bit error ratio (BER) characteristics as a result of simulation in the first embodiment. FIG. 6 is a graph of which the lateral axis represents CNR [dB] and the longitudinal axis represents the average BER, where the value of MMSE is plotted with ×, the value of MLD (prior art) is plotted with Δ, and the value of MLD (present invention) is plotted with ○. This is quasi-static fading characteristics where the simulation is 2×2 MIMO, the modulation system is 64 QAM, and there is no antenna correlation. It can be seen from the graph that the MLD to which the present invention is applied has approximately the same performance as a conventional MLD (prior art).

As described above, the wireless communication device according to the first embodiment has such an approximate configuration that the likelihood, the bit LLR and the mutual information of the results of separation of the received signals are calculated on the basis of the reference signal point selected from among the plurality of signal points that can be taken by the transmission signals, signal points of which the number corresponds to the mutual information are selected as the transmission candidate points in such an order that the distance from 0 and the distance from 1 for each modulation bit that forms the reference signal point (bit likelihood) are smaller, and the MLD operation is carried out by calculating the reception candidate points through the use of the transmission candidate points.

More concretely, the wireless communication device according to the first embodiment operates as follows.

That is to say, the transmission path estimation unit 101 estimates the transmission path between the transmission and reception sides on a basis of the signals received by the multiple receive antenna. The noise power estimation unit (not shown) estimates the received noise power on a basis of the received signals. The ZF/MMSE coefficient calculation unit 102 and the separation detection unit 103 use the results of estimation of the transmission path and the results of estimation of the received noise power so as to separate the received signals by a linear filter in accordance with the ZF method or the MMSE method. The likelihood calculation unit 104 calculates the likelihoods of between the results of separation by the separation detection unit 103 and the reference signal point that is selected from among the plurality of signal points that can be taken by the transmission signals. The LLR calculation unit 105 calculates the bit LLR by using the likelihood that has been calculated by the likelihood calculation unit 104. The mutual information calculation unit 106 calculates the mutual information by using the bit LLR that has been calculated by the LLR calculation unit 105. The transmission candidate point selection unit 107 selects, from among the plurality of signal points, the signal points of which the number corresponds to the mutual information that has been calculated by the mutual information calculation unit 106 as transmission candidate points in an order of smaller to larger the distance from 0 and the distance from 1 for each modulation bit that forms the reference signal point. The reception candidate point generation unit 201 uses the results of estimation of the transmission path and the transmission candidate points so as to calculate the reception candidate points that become the candidates of the received signals. The external LLR calculation unit 202 uses the reception candidate points, the received signals, and the results of estimation of the received noise power so as to calculate the bit LLR in accordance with the MLD method.

As described above, according to the first embodiment, the bit likelihood of the MMSE output and the mutual information are used to select the transmission candidate points of MLD, and the selected transmission candidate points are used to carry out an MLD process so that the number of transmission candidate points and the reception candidate points of the MLD that exponentially increase can be reduced while maintaining performance, which makes the application to an actual system possible.

Figure 7:
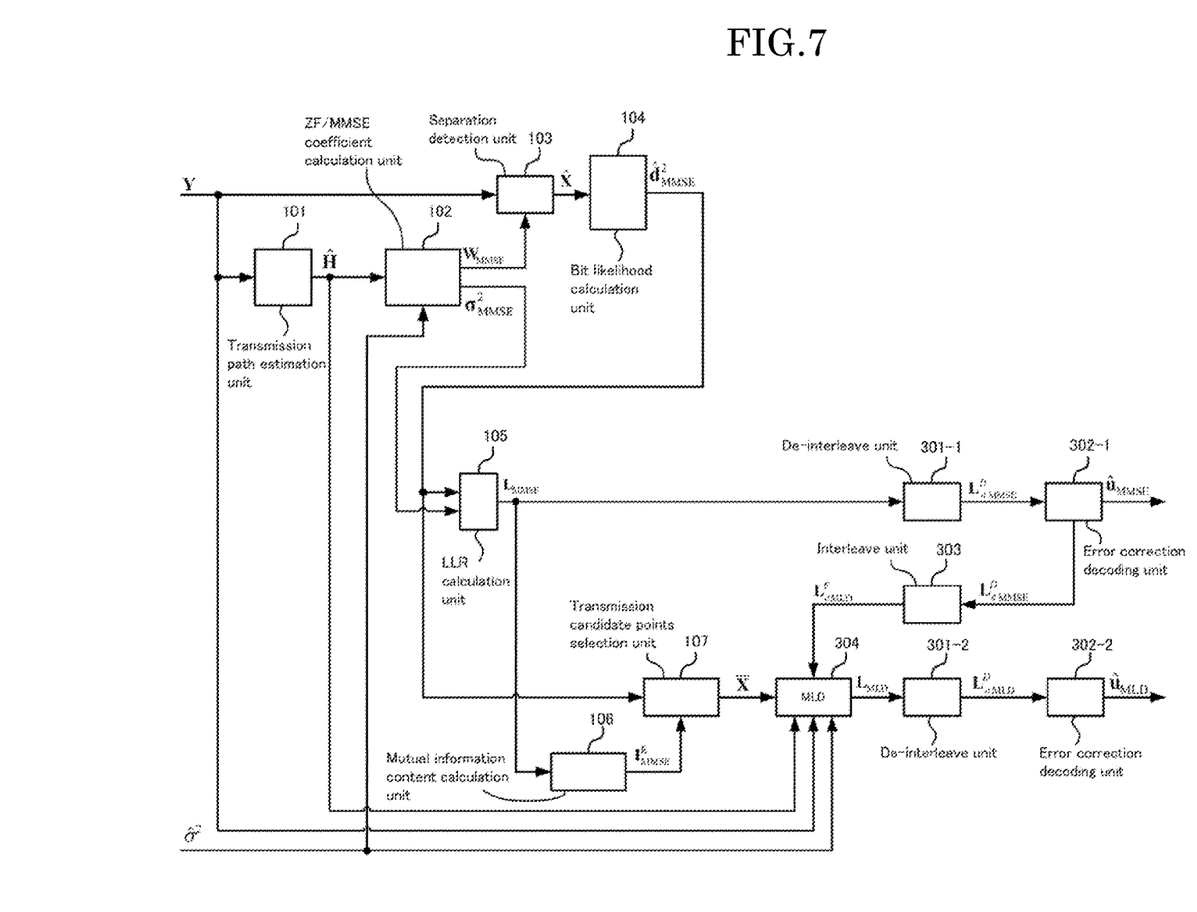
FIG. 7 is a diagram showing an example of a functional block of the wireless communication device according to the second embodiment of the present invention.

FIG. 7 shows an example of a functional block of the wireless communication device according to the second embodiment of the present invention. The wireless communication device according to the second embodiment is provided with a transmission path estimation unit 101, a ZF/MMSE coefficient calculation unit 102, a separation detection unit 103, a likelihood calculation unit 104, an LLR calculation unit 105, a mutual information calculation unit 106, a transmission candidate point selection unit 107, a de-interleave unit 301-1, an error correction decoder 302-1, an interleave unit 303, an MLD processing unit 304, a de-interleave unit 301-2 and an error correction decoder 302-2. The transmission path estimation unit 101, the ZF/MMSE coefficient calculation unit 102, the separation detection unit 103, the likelihood calculation unit 104, the LLR calculation unit 105, the mutual information calculation unit 106 and the transmission candidate point selection unit 107 are the same as in the first embodiment, and therefore, the descriptions thereof are not repeated.

LLR $L_{MMSE}$ that is a series realigned in a predetermined order on the transmission side is inputted into the de-interleave unit 301-1, which carries out a process for returning the series to the original order and outputs the LLR $L_{aMMSE}^D$ that has been returned to the original order to the error correction decoder 302-1. This process is paired with the process in the below-described interleave unit 303.

The error correction decoder 302-1 carries out error correction decoding of the soft input soft output on the inputted LLR $L_{aMMSE}{}^D$ so as to output $\hat{u}_{MMSE}$ which is the results of decoding of the information bit series, and outputs the decoded bit LLR series $L_{aMMSE}{}^D$ to the interleave unit 303.

The interleave unit 303 realigns the inputted LLR $L_{aMMSE}{}^D$ in a predetermined order and outputs $L_{aMLD}{}^E$ which is the results of the realignment to the MLD processing unit 304 as prior information LLR.

The MLD processing unit 304 uses the inputted transmission candidate point matrix X', the received frequency signal vector Y, the transmission path estimation matrix $\hat{H}$, the received noise power $\hat{\sigma}^2$ and prior information LLR $L_{aMLD}{}^E$ so as to find the external LLR $L_{eMLD}{}^E$, which is then outputted. The MLD processing unit 304 is described in detail in reference to FIG. 8.

Figure 8:
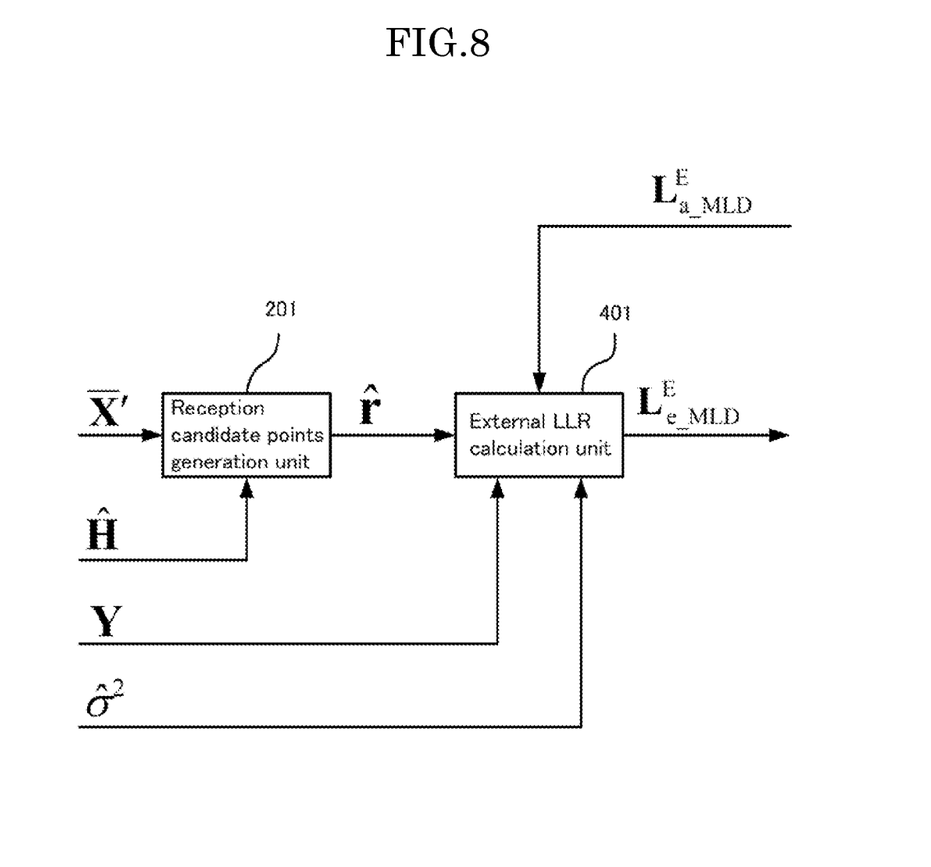
FIG. 8 is a diagram showing an example of the configuration of the MLD processing unit in the second embodiment of the present invention.

FIG. 8 shows an example of the configuration of the MLD processing unit 304 in the second embodiment. The MLD processing unit 304 is provided with a reception candidate point generation unit 201 and an external LLR calculation unit 401. The reception candidate point generation unit 201 is the same as in the MLD processing unit 108 in the first embodiment, and therefore, the description thereof is not repeated.

The external LLR calculation unit 401 uses the inputted reception candidate point vector $\hat{r}$, the received frequency signal vector Y, the received noise power $\hat{\sigma}^2$ and the prior information LLR $L_{aMLD}{}^E$ so as to find the external LLR $L_{eMLD}{}^E$, which is then outputted. Each component $L_{aMLD}{}^E(b_q, j)$ of the external LLR $L_{eMLD}{}^E$ is calculated in the following formula, for example.

[Formula 17]

$$L_{e\ MLD}^E(b_q, j) = \log \frac{\sum_{\hat{r}_q | b_q = 0} \frac{1}{\pi \hat{\sigma}^2} \exp\left(-\left(\frac{|\hat{r}_q - Y_j|}{\hat{\sigma}^2} + \sum_i b_q(\hat{r}_q) L_{a\_MLD}^E\right)\right)}{\sum_{\hat{r}_q | b_q = 0} \frac{1}{\pi \hat{\sigma}^2} \exp\left(-\left(\frac{|\hat{r}_q - Y_j|}{\hat{\sigma}^2} + \sum_i b_q(\hat{r}_q) L_{a\_MLD}^E\right)\right)} - L_{a\ MLD}^E(b_q, j)$$

$$= \log \frac{\sum_{\hat{r}_q | b_q = 0} \exp\left(-\left(\frac{|\hat{r}_q - Y_j|}{\hat{\sigma}^2} + \sum_i b_q(\hat{r}_q) L_{a\_MLD}^E\right)\right)}{\sum_{\hat{r}_q | b_q = 1} \exp\left(-\left(\frac{|\hat{r}_q - Y_j|}{\hat{\sigma}^2} + \sum_i b_q(\hat{r}_q) L_{a\_MLD}^E\right)\right)} - L_{a\ MLD}^E(b_q, j)$$

$$= \log\left(\sum_{\hat{r}_q | b_q = 0} \exp\left(-\left(\frac{|\hat{r}_q - Y_j|}{\hat{\sigma}^2} + \sum_i b_q(\hat{r}_q) L_{a\_MLD}^E\right)\right)\right) - \log\left(\sum_{\hat{r}_q | b_q = 1} \exp\left(-\left(\frac{|\hat{r}_q - Y_j|}{\hat{\sigma}^2} + \sum_i b_q(\hat{r}_q) L_{a\_MLD}^E\right)\right)\right) - L_{a\ MLD}^E(b_q, j)$$

Here, $b_q(\hat{r}_q)$ is the $q^{th}$ bit (0 or 1) of the signal point vector that forms the reception candidate point $\hat{r}_q$. In addition, an approximation of the above-described Formula 6 is used to gain the following formula.

[Formula 18]

$$L_{e\ MLD}^E(b_q, j) = \min_{\hat{r}_q | b_q = 0}\left(\frac{|\hat{r}_q - Y_j|}{\hat{\sigma}^2} + \sum_i b(\hat{r}_q, i) L_{a\_MLD}^E\right) - \min_{\hat{r}_q | b_q = 1}\left(\frac{|\hat{r}_q - Y_j|}{\hat{\sigma}^2} + \sum_i b(\hat{r}_q, i) L_{a\_MLD}^E\right) - L_{a\ MLD}^E(b_q, j) \quad \text{(Formula 18)}$$

LLR $L_{eMLD}{}^E$ that is a series realigned in a predetermined order on the transmission side is inputted into the de-interleave unit 301-2, which carries out a process for returning the series to the original order and outputs the LLR $L_{aMLD}{}^D$ that has been returned to the original order to the error correction decoder 302-2.

The error correction decoder 302-2 carries out error correction decoding of the soft input soft output on the inputted LLR $L_{aMLD}{}^D$ and outputs the results of decoding $\hat{u}_{MLD}$ of the information bit series.

As described above, the wireless communication device according to the second embodiment is provided by further improving the wireless communication device according to the first embodiment.

That is to say, the functional units such as the de-interleave unit 301-1, the error correction decoder 302-1 and the interleave unit 303 (hereinafter, referred to as the error correction decoder 302-1 and the like), into which the bit LLR that has been calculated by the LLR calculation unit 105 has been inputted, output the error corrected bit LLR. The external LLR calculation unit 202 uses the bit LLR that has been outputted by the error correction decoder 302-1 and the like as the prior bit LLR, and calculates the bit LLR in accordance with the MLD method by using the reception candidate points, the received signals, the results of estimation of the received noise power and the prior bit LLR.

As described above, in accordance with the second embodiment, the bit likelihood of the MMSE output and the mutual information are used so as to select the transmission candidate points of the MLD, and in addition, error correction decoding of the soft input soft output is carried out on the bit LLR that is gained from the MMSE output so as to find an error corrected bit LLR, which is used as prior LLR of the MLD, so that the selected transmission candidate points and the prior LLR are used to carry out an MLD process, which makes it possible to increase the performance possible as compared to the first embodiment.

Here, the configurations of the system and device according to the present invention are not necessarily limited to the ones described in the above, but various configurations may be used.

In addition, the present invention can be provided as a method or a system for implementing the process according to the present invention, or as a program for implementing such a method or system or a recording media for storing such a program. This application claims the benefit of prior art on the basis of Japanese Patent Application 2016-105572 filed on May 26, 2016, and the entirety of the disclosure thereof is incorporated herein by reference.

INDUSTRIAL APPLICABILITY

The present invention can be applied to various types of wireless communication devices for receiving by multiple receive antenna transmission signals that have been transmitted from multiple transmission antenna.

REFERENCE SIGNS LIST

101 . . . transmission path estimation unit
102 . . . ZF/MMSE coefficient calculation unit
103 . . . separation detection unit
104 . . . likelihood calculation unit
105 . . . LLR calculation unit
106 . . . mutual information calculation unit
107 . . . transmission candidate point selection unit
108 . . . MLD processing unit
201 . . . reception candidate point generation unit
202 . . . external LLR calculation unit
301-1, 301-2 . . . de-interleave unit
302-1, 302-2 . . . error correction decoding unit
303 . . . interleave unit
304 . . . MLD processing unit
401 . . . external LLR calculation unit

The invention claimed is:

1. A wireless communication device for receiving signals transmitted from multiple transmission antenna by multiple receive antenna and separating received signals, the wireless communication device being characterized by comprising:
a transmission path estimation unit that estimates a transmission path between the transmission and reception sides on a basis of signals received by the multiple receive antenna;
a noise power estimation unit that estimates a received noise power on a basis of the received signals;
a separation unit that separates the received signals by a linear filter in accordance with a ZF method or an MMSE method by using the results of estimation of the transmission path and the results of estimation of the received noise power;
a likelihood calculation unit that calculates a likelihood of between the results of separation by the separation unit and a reference signal point selected from among a plurality of signal points that can be taken by transmission signals;
a first bit LLR calculation unit that calculates a bit LLR by using the likelihood calculated by the likelihood calculation unit;
a mutual information calculation unit that calculates a mutual information by using the bit LLR calculated by the first bit LLR calculation unit;
a selection unit that selects, from among the plurality of signal points, signal points of which the number corresponds to the mutual information calculated by the mutual information calculation unit as transmission candidate points in an order of smaller to larger a distance from 0 and a distance from 1 for each modulation bit that forms the reference signal point;
a reception candidate point calculation unit that calculates reception candidate points that become candidates of the received signals by using the results of estimation of the transmission path and the transmission candidate points; and
a second bit LLR calculation unit that calculates a bit LLR in accordance with an MLD method by using the reception candidate points, the received signals and the results of estimation of the received noise power.

2. The wireless communication device according to claim 1, characterized by further comprising an error correction unit, into which the bit LLR calculated by the first bit LLR calculation unit is inputted, that outputs an error corrected bit LLR, wherein
the second bit LLR calculation unit uses the bit LLR outputted from the error correction unit as a prior bit LLR so as to calculate the bit LLR in accordance with the MLD method by using the reception candidate points, the received signals, the results of estimation of the received noise power and the prior bit LLR.

3. A wireless communication method that can be implemented in a wireless communication device for receiving signals transmitted from multiple transmission antenna by multiple receive antenna and separating received signals, the wireless communication method being characterized by comprising:
a transmission path estimation step of estimating a transmission path between the transmission and reception sides on a basis of signals received by the multiple receive antenna;
a noise power estimation step of estimating a received noise power on a basis of the received signals;
a separation step of separating the received signals by a linear filter in accordance with a ZF method or an MMSE method by using the results of estimation of the transmission path and the results of estimation of the received noise power;
a likelihood calculation step of calculating the likelihood of between the results of separation in the separation step and a reference signal point selected from among a plurality of signal points that can be taken by transmission signals;
a first bit LLR calculation step of calculating a bit LLR by using the likelihood calculated in the likelihood calculation step;
a mutual information calculation step of calculating a mutual information by using the bit LLR calculated in the first bit LLR calculation step;
a selection step of selecting, from among the plurality of signal points, signal points of which the number corresponds to the mutual information calculated in the mutual information calculation step as transmission candidate points in an order of smaller to larger a distance from 0 and a distance from 1 for each modulation bit that forms the reference signal point;
a reception candidate point calculation step of calculating reception candidate points that become candidates of the received signals by using the results of estimation of the transmission path and the transmission candidate points; and
a second bit LLR calculation step of calculating a bit LLR in accordance with an MLD method by using the reception candidate points, the received signals and the results of estimation of the received noise power.

* * * * *